United States Patent [19]

Nielsen

[11] Patent Number: 4,792,951
[45] Date of Patent: Dec. 20, 1988

[54] APPARATUS AND METHOD OF STIMULATING AN EQUIPMENT

[75] Inventor: Robert E. Nielsen, Farmingville, N.Y.

[73] Assignee: Grumman Aerospace Corporation, Bethpage, N.Y.

[21] Appl. No.: 906,057

[22] Filed: Sep. 11, 1986

[51] Int. Cl.[4] .......................................... G06F 11/00
[52] U.S. Cl. ................................................ 371/27
[58] Field of Search ................ 371/15, 16, 25, 27; 324/73 R, 73 AT; 264/200 MS File, 900 MS File

[56] References Cited

U.S. PATENT DOCUMENTS

| | | | |
|---|---|---|---|
| 4,106,109 | 10/1971 | Fassbender | 365/238 |
| 4,285,059 | 8/1981 | Burlage | 371/25 |
| 4,347,587 | 9/1982 | Rao | 365/189 |
| 4,388,719 | 6/1983 | Soltysik | 371/27 |
| 4,688,223 | 8/1987 | Motika | 371/27 |

OTHER PUBLICATIONS

J. Atlas, R. Nielsen, "High-Speed Digital Test Capability for Emerging Technology", IEEE, 1983, CH1968-7/83/0000-0463.

Primary Examiner—Jerry Smith
Assistant Examiner—Robert W. Beausoliel
Attorney, Agent, or Firm—Pollock, VandeSande & Priddy

[57] ABSTRACT

By using a combination memory, shift register, logic gates and buffers, a stimulator used in an automatic testing instrument is able to provide two data rates for stimulating different equipment under test. The fast data rate is obtained by serially shifting parallel inputted data from the memory at a much faster rate than the operational speed of the memory. To accommodate equipment having a lower operating frequency, stimuli are transmitted to the equipment in a parallel mode.

16 Claims, 3 Drawing Sheets

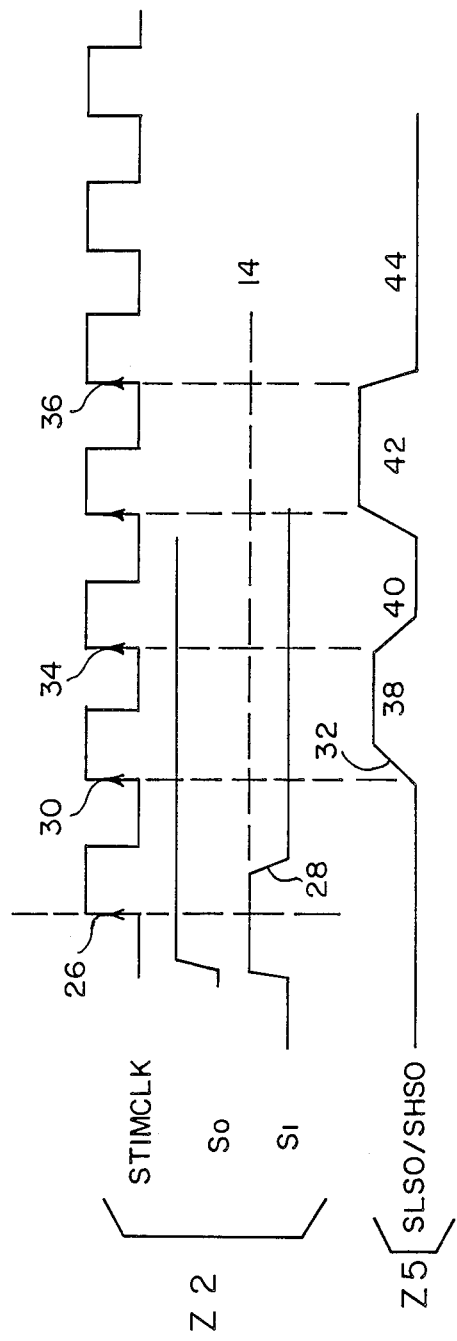

APPARATUS AND METHOD OF STIMULATING AN EQUIPMENT

FIELD OF THE INVENTION

The present invention is directed to an automatic testing instrument and more particularly, to a stimulator used in the instrument for eliciting responses from an equipment under test.

BRIEF DESCRIPTION OF THE PRIOR ART

There have been numerous attempts to create digital data patterns for stimulating an equipment under test. For example, where a radar system of an aircraft is to be tested, stimuli representing different patterns need to be fed into the radar system in order to educe therefrom a response, which then is compared with an expected result for determining the operational status of the system. Since the number of equipment which may be tested is dependent upon the rate whereby the patterns are generated from the automatic testing instrument, previous attempts have concentrated in the area of increasing the data rates of the stimuli sent out by the stimulator. This concept was discussed in the article entitled "High Speed Digital Test Capability for Emerging Technology", which has as one of its authors the inventor of the present application. In that article, the concept of using a parallel/serial shift register and a memory for increasing the data rate was disclosed. At the time, it was thought that the automatic testing equipment would operate at a much greater efficiency with such an increase in the data rate. However, upon further evaluation, it was found that since there are a number of equipment that need to be tested at a slower data rate, a stimulator which could generate both the higher data rate and a slower data rate is required.

BRIEF DESCRIPTION OF THE PRESENT INVENTION

The present invention provides a stimulator for an automatic testing instrument which is capable of generating a high speed data rate and a low speed data rate. To accomplish this, data (representing patterns) from a controller, in this instance, a microprocessor, are fed in parallel to a 16K RAM and stored therein. If a high data speed of a particular pattern is required, the controller addresses the memory and loads the pattern into a fast acting shift register. The data bits (of the pattern) are then shifted by this shift register and fed serially to an output via some logic circuits to stimulate at a high data rate an equipment under test. If this equipment requires a slower data rate or requires real time stimulation from the controller, the shift register would output the data in parallel to the equipment for stimulating the same.

Therefore, it is an objective of the present invention to provide a stimulator in an automatic testing instrument which is capable of generating stimuli at fast and slow rates.

It is another objective of the present invention to provide a stimulator which can interact with other components of the automatic testing instrument.

The above-mentioned objects and advantages of the present invention will become more apparent and the invention itself will be best understood by reference to the following description of an embodiment of the invention taken in conjunction with the accompanying drawings, wherein:

BRIEF DESCRIPTION OF THE FIGURES

FIG. 3 is a timing diagram of the FIG. 2 embodiment.

DETAILED DESCRIPTION OF THE PRESENT INVENTION

Figure 1:
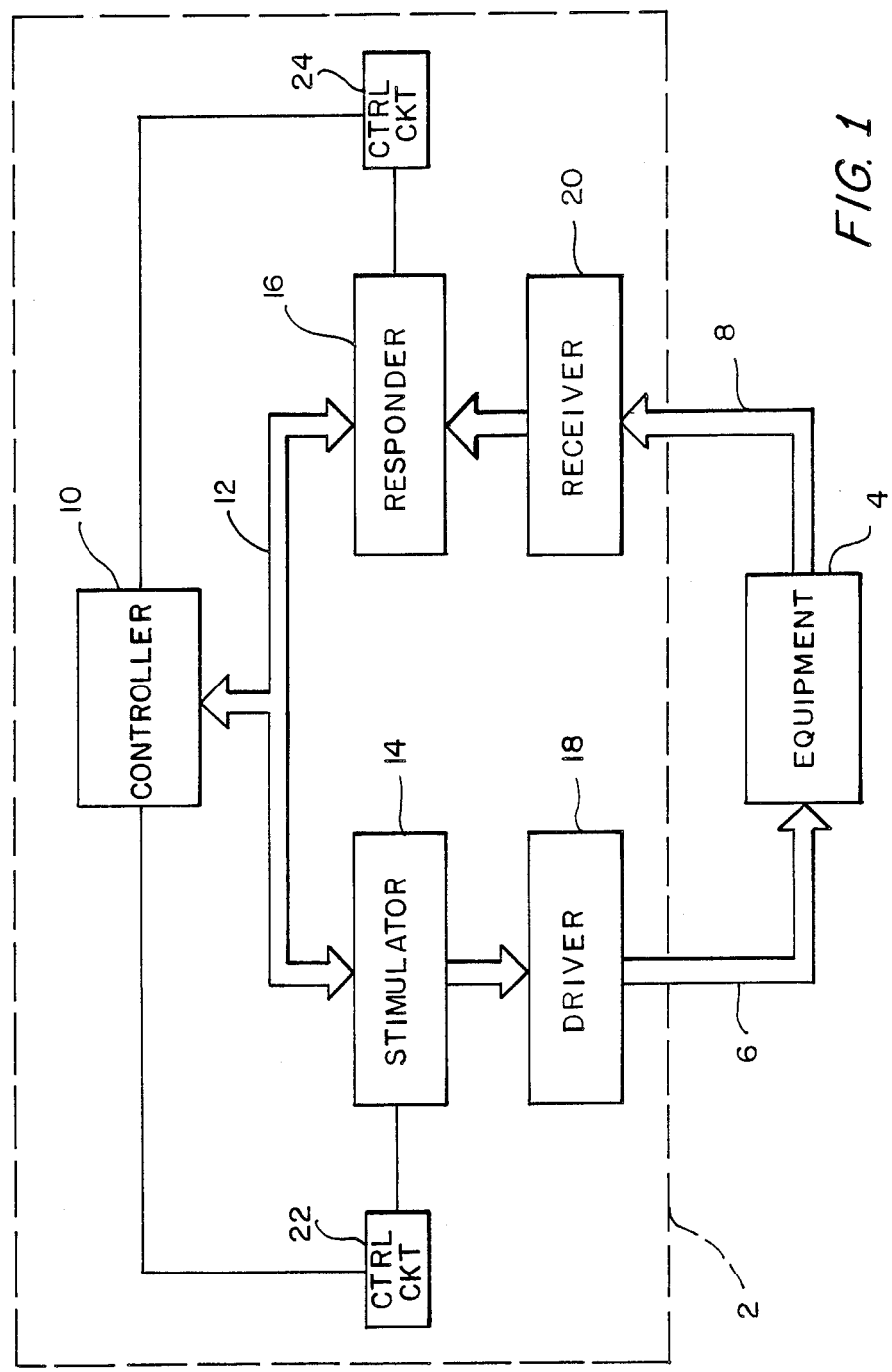
FIG. 1 is a simplified block diagram of an automatic testing instrument.

FIG. 1 shows an automatic testing instrument 2 which is used to test any number of equipment which are connected thereto. Putting it simply, equipment may be connected via driver line 6 and receiver line 8 to the automatic testing instrument. Signals are sent from automatic testing instrument 2 via driver line 6 to equipment 4 for stimulating the same. Responses due to the stimuli and generated from equipment 4 are transmitted through receiver line 8 back to the automatic testing instrument. Hence, automatic testing instrument 2 performs both the generation of stimuli and the receiving and subsequent analysis of the responses from an equipment under test for determining the operational status of that equipment.

Within automatic testing instrument 2 is a controller 10, which is connected by bus 12 to stimulator 14 and responder 16. For this embodiment, a microprocessor such as one from the Intel family may be used. Were it desirable to test an equipment with a particular pattern, controller 10 would send data representing that pattern, as well as instructions, to stimulator 14. Upon receiving the data and instructions, stimulator 14 generates and transmits corresponding stimuli to driver 18, which is described in a co-pending application by John M. Weick and assigned to the same assignee with Ser. No. 059,075. The stimuli is driven by driver 18 to equipment 4. Responses resulting from the stimuli are transmitted by equipment 4 to receiver 20, which is described in a co-pending application by Joseph Langone and Michael Ugenti, assigned to the same assignee with U.S. Pat. No. 4,743,842. Signals from receiver 20 are then sent to responder 16, which is described in a co-pending application by the inventor of the instant application and assigned to the same assignee with Ser. No. 016,685. The outputs from responder 16, which outputs are representative of responses from equipment 4, are fed to controller 10, where the operational status of equipment 4 can be determined from these outputs.

It should be noted that within automatic testing instrument 2 are two sets of control circuits 22 and 24, which control the operations of stimulator 14 and responder 16, respectively. These control circuits are conventional types of circuits and are used to relay information to the control lines of the stimulator and responder. It should be appreciated that although only equipment 4 is shown to be connected to automatic testing instrument 2, a plurality of equipment such as equipment 4 can also be added on to the automatic testing instrument, as a plurality of corresponding stimulators, driver responders, and receivers can be added within an automatic testing instrument. It should also be noted that all of the buses shown are conventional and that bi-directional bus line 12 is a VME bus made by Motorola.

Figure 2:
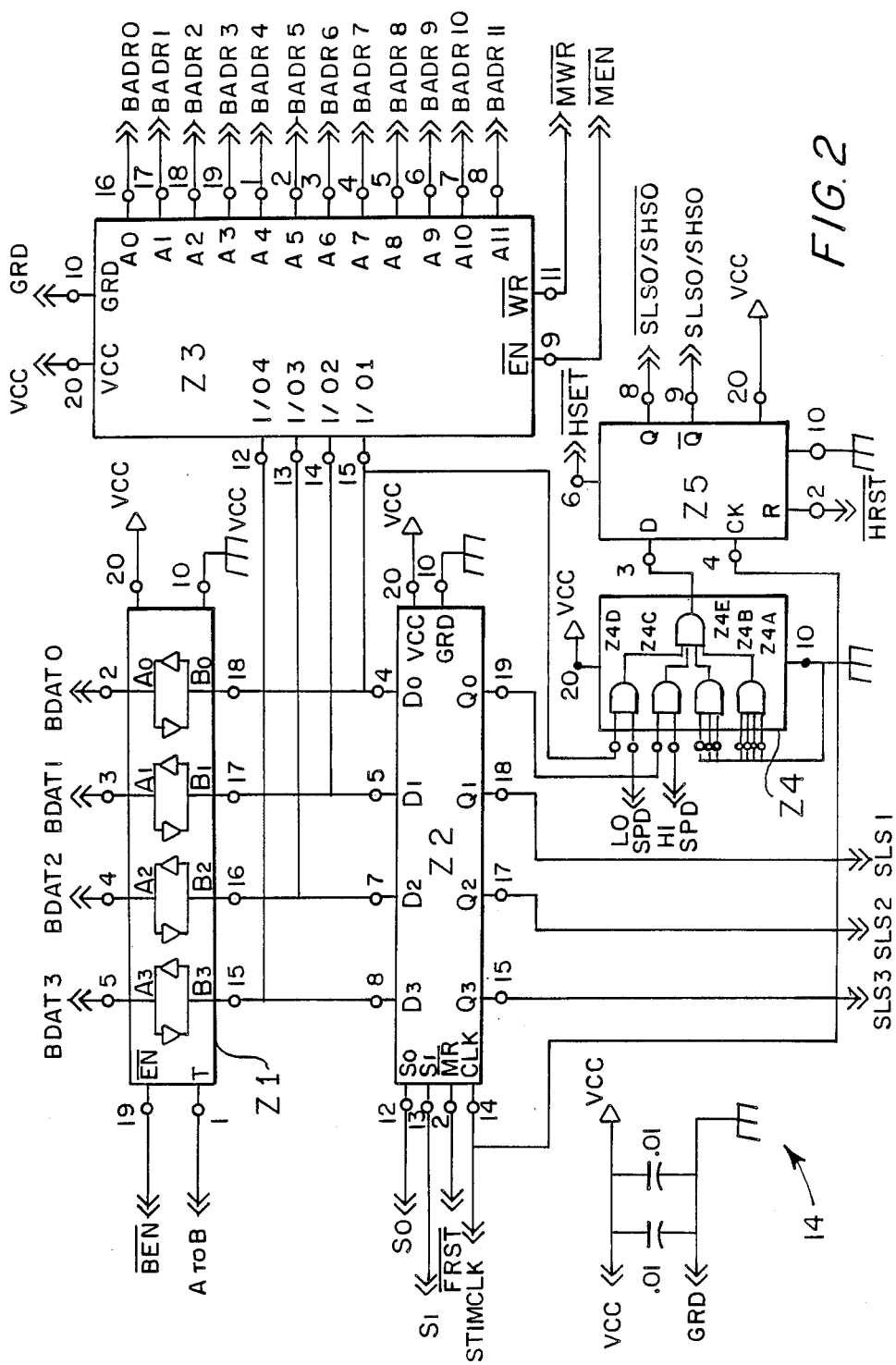
FIG. 2 is a schematic diagram showing one preferred embodiment of the present invention.

Focus now on stimulator 14 of FIG. 2. As shown, stimulator 14 contains five major components: a bi-directional bus driver Z1, a serial/parallel 4 bit shift register Z2, a memory Z3, an inverter gate Z4 and a flip-flop Z5. Referring now to bi-directional bus driver Z1, it is seen that pins 2, 3, 4 and 5 thereof are connected as buffer data lines BDAT0, BDAT1, BDAT2, and BDAT3, respectively, to controller 10 (not shown in FIG. 2). Pins 18, 17, 16, and 15 of bi-directional bus buffer Z1 are connected to corresponding inputs of 4, 5, 7 and 8 of shift register Z2, as well as corresponding pins 15, 14, 13, and 12 of memory Z3. Bi-directional bus buffer Z1 is controlled by controlled circuit 22 (see FIG. 1) via lines BEN and line (A to B).

Looking at memory Z3, it can be seen that there are 12 address lines BADR0 to BADR11, connected respectively to inputs A0 to A11, for placing data transmitted by bi-directional bus buffer Z1 on input/output ports I/O1 to I/O4 of the memory in appropriate addresses in the memory. For controlling memory Z3, lines MWR and MEN are used. All of these control lines, of course, are connected to controller circuit 22.

Parallel/serial shift register Z2 has four outputs: Q0, Q1, Q2 and Q3 which correspond to inputs D0, D1, D2 and D3 thereof. There are four lines connected to the respective outputs Q0 to Q3. Three of the lines, designated as SLS1, SLS2 and SLS3, are connected directly to driver 18 (shown in FIG. 1). The remaining line, which corresponds to output Q0, is connected to an input of inverter Z4. Shift register Z2 is controlled by operational lines $S_0$, $S_1$, FRST and STIMCLK. The $S_0$ and $S_1$ lines are used to set shift register Z2 into four different modes of operation while line FRST is the reset line and line STIMCLK is the timing input for the memory.

As was mentioned previously, only one output, that is Q0 of shift register Z2, is connected to inverter Z4, which is used to designate whether stimulator 14 is to operate in the high or low data rates. Within inverter Z4 are five AND gates Z4A to Z4E. Since only two inputs are fed into inverter Z4, two of the AND gates therein, Z4A and Z4B, are grounded. Z4C is used for high speed operation and has as one of its inputs output $Z_0$ of shift register Z2. AND gate Z4D is used for low speed operation and has as one of its inputs data located on input/output port I/O1 of memory Z3. AND gates Z4C and Z4D are connected to AND gate Z4E, which output is fed to input D of flip-flop Z5. It should be noted that flip-flop Z5 is used as a buffer for outputting any data, to be used as stimulus, to driver 18 (see FIG. 1).

In operation, controller 10 loads data, as four bits, via lines BDAT0 to BDAT3 to bi-directional bus buffer Z1. If line (A to B) is high and line BEN is enabled, then data fed from controller 10 is transmitted from pins 2, 3, 4 and 5 of bi-directional bus buffer Z1 to corresponding output pins 18, 17, 16, and 15. It should be noted that if line BEN is not enabled, then the data fed from controller 10 would stay within buffer Z1; and if line (A to B) is low and line BEN is enabled, then the data residing in buffer Z1 would be transmitted back to controller 10. The following IC chips may be used as bi-directional bus buffer Z1: SN54ALS245FH-00 from Texas Insrruments, S54LS245G from Signetics and 54F245 from Fairchild.

Suppose that data in buffer Z1 is to be stored in memory Z3. Since memory Z3 is a 16K RAM which is made by INMOS having part number IMS1420-45, 4,000 addresses—4,096 to be exact—are available in memory Z3. As was mentioned previously, lines BADR0 to BADR11 are used to place the four bit data into a specific location and to withdraw this data from that location upon command. The loading and unloading of data from memory Z3 are controlled by lines MWR and MEN. For example, were a four bit data on input/output ports I/O1 to I/O4 to be stored into locations specified on the address line having a binary number between 0 and 4,000, lines MWR and MEN would both be enabled. Conversely, if it is decided to withdraw data from memory Z3, then line MEN is enabled while line MWR stays low. In this instance, the data that was stored in the location corresponding to the binary address configuration appearing on lines BADR0 to BADR11 would be placed at input ports I/O1 to I/O4.

By being able to use any one of the 4,000 addresses in memory Z3, controller 10 could load up any number of address lines between 0 and 4,000, start an external counter for incrementing the address lines from 0 through some number, thereby transferring the data in memory Z3, in accordance to a predetermined rate (determined by the frequency of the clock and the maximum operational speed of memory Z3) to shift register Z2, a S54F194G chip from Signetics, for example.

Once data has been transferred from memory Z3 to shift register Z2, it is immediately available on lines SLS1, SLS2, and SLS3 thereof. By controlling lines $S_0$ and $S_1$, shift register Z2 can operate in four possible modes. First, shift register can stay in the off state by ignoring clock pulses from line STIMCLK. Second, whatever data is on input pins 4, 5, 7 and 8 may be outputted in parallel to lines 19, 18, 17 and 15, respectively. Third, data may be serially shifted to the left. Fourth, data may be serially shifted to the right. For this embodiment, the serial shift left mode would be used, were it desired to output the data at an increased rate. Since the maximum operational frequency of memory Z3 is 20 MHz and that of shift register Z2 is 50 MHz, two different speeds, i.e., high and low, may be used in stimulator 14. In other words, the data which has been loaded into shift register Z2 from memory Z3 may be outputted either in parallel or serially. Inverter Z4 and flip-flop Z5 are elements which, when combined with shift register Z2, allow stimulator 14 to use either the significantly faster rate or the slower rate.

To operate stimulator 14 at a faster rate, data is inputted in parallel to shift register Z2 from memory Z3. But instead of outputting the data in parallel, lines $S_0$ and $S_1$ are enabled, thereby setting the shift register into the shift left mode; and for the next four clock pulses, the data which was strobed into shift register Z2 from memory Z3 is transferred as a serial data string from output $Q_0$. Since the operational frequency of shift register Z2 has an output limit of about 50 million bits/second, the stimulator is able to, with the help of inverter Z4 and flip-flop Z5, provide 50 million stimuli per second. Putting it more concisely, by setting shift register Z2 to serial mode and enabling line HISPD of inverter Z4, the data that was loaded in parallel into shift register Z2 would be shifted out as a serial chain of 4 bits from flip flop Z5. Accordingly, the data rate would be greater than two times that which may have been gotten out were data outputted in parallel directly into the equipment under test. Since the combination shift register Z2, inverter Z4 and flip-flop Z5 actually perform a parallel to serial conversion, it would appear that patterns are being strobed out much faster from the memory—when in fact the memory is operating at a much slower rate. While the 4 bits are being serially shifted out of shift register Z2, control circuit 22 can instruct memory Z3 to get the next 4 bits ready. Thus, although memory Z3 is operating only at a rate of 20 million bits/second, fifty million bits per second are being outputted from stimulator 14.

Realizing that only a small subset of the many equipment under test would require a high data rate, stimulator 14, while providing for such faster data rate, also provides a slower data rate by using the combination shift register, inverter Z4 and flip-flop Z5. To get this lower data rate, line LOSPD of inverter Z4 is enabled while line HISPD stays low. In this instance, the output from flip-flop Z5 would look simply like output $Q_0$ of shift register Z2. Of course, lines $S_0$ and $S_1$ of shift register Z2 must be set to the parallel outputting mode. With the appropriate settings, data—which can be fed either from memory Z3 or directly from bi-directional buffer Z1—are outputted in parallel by shift register 2, in combination with inverter Z4 and flip-flop Z5, to the equipment under test.

Referring now to FIG. 3, assume that memory Z3 had previously been fed data from controller 10 and that lines $S_0$ and $S_1$ of shift register Z2 are both enabled. Therefore, looking at lines $S_0$, $S_1$ and STIMCLK of shift register Z2, it can be seen that at the leading edge of first clock pulse 26 (of line STIMCLK), whatever data in memory Z3 is parallel loaded into shift register Z2. At the same time, an external counter increments the memory's addresses so that over the next four clock pulses, the memory address will be incremented by one and data are fetched. Right after the first clock pulse, line $S_1$ is reset at point 28. At that point, shift register changes from the parallel loading mode to the shift left mode. At leading edge 30 of the next clock pulse, data which was parallel loaded into $Q_0$ of register Z2 is strobed through inverter Z4 into flip-flop Z5, thereby appearing at output line SLSO/SHSO. This is shown at 32.

At the same time, data which was in $Q_1$ of shift register Z2 is shifted to $Q_0$ thereof (and data in $Q_2$ is shifted to $Q_1$ while data in $Q_3$ is shifted to $Q_2$). At the next clock pulse, shown as 34, pin 9 of flip-flop Z5, i.e., line SLSO/SHSO, will have the data that is currently in $Q_0$, but which was originally strobed into $Q_1$. This process continues through four clock pulses; at the end of which four new bits from memory Z3 are loaded into shift register Z2, thereby repeating the cycle, starting at point 36. The four bits of data which were outputted on line SLSO/SHSO of flip-flop Z5 are shown as 38, 40, 42, and 44.

From the above discussion, it should be appreciated that the present invention is capable of providing different data rates for different equipment under test.

Inasmuch as the present invention is subject to many variations, modifications, and changes in detail, it is intended that all matters described throughout this sspecification and shown in the accompanying drawings be interpreted as illustrative and not in a limiting sense. Accordingly, it is intended that the invention be limited only by the spirit and scope of the appended claims.

I claim:

1. In an apparatus for testing an equipment connected thereto, the apparatus including a controller means and a plurality of driver, receiver and stimulator means, the driver means transmitting stimuli generated from the stimulator means to the equipment and the receiver means relating the signals generated by the equipment in response to the stimuli to the controller means, each stimulator means comprising:

input means connected to the controller means for receiving data and instructions therefrom; each data having multiple bits of information, the multiple bits being received in parallel by the input means;

storage means connected to the input means and communicating with the controller means for storing in parallel the data from the controller means, the storage means operating at a first speed;

register means having a plurality of output ports connected to the storage means and communicating with the controller means for receiving in parallel from the storage means sets of multiple bits, the register means capable of operating in the serial mode by shifting the bits serially at a second speed, the second speed being faster than the first speed, the register means further capable of operating at a parallel mcde by transmitting the received multiple bits in parallel through the output ports;

wherein, upon receiving a command from the controller means to operate in the serial mode, the register means shifts the bits serially and outputs the serially shifted bits through one of the output ports to the equipment, thereby stimulating the equipment at a rate equal to the second speed.

2. Stimulator means according to claim 1, wherein the register means is further connected to the input means for receiving in parallel therefrom multiple bits fed from the controller means, wherein, upon receiving a command from the controller means to operate in the parallel mode, the register means transmits the received bits in parallel through the output ports to the equipment, thereby stimulating the equipment at a rate equal to the speed at which the controller means feeds the multiple bits to the input means.

3. Stimulator means according to claim 1, wherein, upon receiving a command from the controller means to operate in the parallel mode, the register means outputs the bits received in parallel from the storage means in parallel to the equipment, thereby stimulating the equipment at a rate equal to the first speed.

4. Stimulator means according to claim 3, further comprising:

switching means interposed between the register means and the equipment, the switching means having an input connected to the one output port of the register means and an output electrically connected to the equipment, the switching means communicating with the controller means, wherein, upon receiving a command from the controller means to operate in a serial mode, the switching means transmits the bits serially inputted from the register means to the equipment for stimulating the equipment at a rate equal to the second speed.

5. Stimulator means according to claim 4, further comprising:

buffer means interposed between the switching means and the equipment for matching respective impedances between the switching means and a corresponding driver means.

6. Stimulator means according to claim 3, further comprising:

switching means interposed between the register means and the equipment, the switching means having an input connected to the one output port of the register means and an output electrically connected to the equipment, the switching means communicating with the controller means, wherein, upon receiving a command from the controller means to operate in a parallel mode, the switching means transmits only the bit inputted from the one output port to the equipment for partially stimulating the equipment at a rate equal to the first speed.

7. Stimulator means according to claim 6, further comprising:
buffer means interposed between the switching means and the equipment for matching respective impedances between the switching means and a corresponding driver means.

8. Stimulator means according to claim 1, wherein the input means comprises a bi-directional bus buffer.

9. Stimulator means according to claim 1, wherein the storage means comprises a RAM.

10. Stimulator means according to claim 1, wherein the register means comprises a parallel/serial 4 bit shift register.

11. Stimulator means according to claim 1, wherein the switching means comprises a logic inverter gate.

12. A stimulator for effecting at an increased rate responses from an equipment under test, comprising:
a bi-directional input buffer connected to a controller for receiving therefrom data sets having multiple bits, the input buffer having a plurality of inputs and outputs;
a memory having a plurality of bi-directional ports each connected to a corresponding output of the input buffer for receiving in parallel the multiple bits, the memory being addressed by the controller for storing each set of multiple bits in a particular location within the memory, the memory operating at a first speed;
a shift register having a plurality of inputs each connected to a corresponding output of the input buffer and to a corresponding bi-directional port of the memory, the shift register capable of receiving in parallel multiple bits of data from the input buffer and the memory; wherein, having inputted thereon the multiple bits of data, the shift register, upon receiving a first command from the controller, shifts the multiple bits serially at a second speed and outputs the bits individually at one of its multiple number of outputs, the second speed being faster than the first speed; and further wherein, the shift register, upon receiving a second command from the controller, outputs the inputted multiple bits in parallel through its outputs at the first speed;
a logic switch having an input connected to one of the outputs of the shift register for receiving data outputted therefrom and for transferring the same to an output buffer, the switch capable of being set to parallel and serial modes, wherein the switch transfers the received data at the first speed when set to the parallel mode and at the second speed when set to the serial mode;
whereby the output buffer transmits the data to the equipment, the equipment being stimulated at the first speed when the switch is set to the parallel mode and at the second speed when the switch is set to the serial mode.

13. Stimulator according to claim 12, wherein the output buffer is a D-type flip-flop.

14. A stimulator according to claim 12, wherein the memory comprises a RAM.

15. A method of stimulating an equipment under test with more than one data rate, comprising:
inputting in parallel to an input buffer a plurality of sets of data, each set of data including multiple bits, the bits being representative of data sent by a controller means;
inputting the sets of multiple bits in parallel to a memory means;
addressing the memory means to store each set of multiple bits in a particular location;
withdrawing different sets of multiple bits from the memory and feeding the multiple bits in parallel to a register means;
outputting the bits in the register means in parallel at a first speed to the equipment upon receiving a first command from the controller means; and
shifting the bits in the register means serially and outputting the serially shifted bits individually to the equipment at a second speed upon receiving a second command from the controller means;
thereby stimulating the equipment at a first speed with no shifting of the bits and stimulating the equipment at a second speed with shifting of the bits, the second speed being faster than the first speed.

16. Method according to claim 15, wherein the inputting step further comprises:
inputting the sets of multiple bits in parallel to the register means, thereby bypassing the memory means.

* * * * *

UNITED STATES PATENT AND TRADEMARK OFFICE
CERTIFICATE OF CORRECTION

PATENT NO. : 4,792,951

DATED : December 20, 1988

INVENTOR(S) : Robert E. Nielsen

It is certified that error appears in the above-identified patent and that said Letters Patent is hereby corrected as shown below:

Column 3, bridging lines 58 and 59, change "Insrruments" to --Instruments--.

Column 5, line 37, change "Q2" to --$Q_2$--.

Column 5, line 54, change "sspecification" to --specification--.

Signed and Sealed this

Twenty-fifth Day of April, 1989

*Attest:*

DONALD J. QUIGG

*Attesting Officer*     *Commissioner of Patents and Trademarks*